United States Patent
Huang et al.

(10) Patent No.: US 10,916,417 B2
(45) Date of Patent: Feb. 9, 2021

(54) PRE-PROCESSING METHOD, METHOD FOR FORMING METAL SILICIDE AND SEMICONDUCTOR PROCESSING APPARATUS

(71) Applicant: Nexchip Semiconductor Corporation, Anhui (CN)

(72) Inventors: Chih-Hsien Huang, Anhui (CN); Xiaodong Liu, Anhui (CN); Jian-Zhi Fang, Anhui (CN); Chen-Hao Liu, Anhui (CN)

(73) Assignee: NEXCHIP SEMICONDUCTOR CORPORATION, Anhui (CN)

( * ) Notice: Subject to any disclaimer, the term of this patent is extended or adjusted under 35 U.S.C. 154(b) by 0 days.

(21) Appl. No.: 16/902,408

(22) Filed: Jun. 16, 2020

(65) Prior Publication Data

US 2021/0013028 A1 Jan. 14, 2021

(30) Foreign Application Priority Data

Jul. 8, 2019 (CN) .......................... 2019 1 0611966

(51) Int. Cl.
| | |
|---|---|
| *H01L 21/3205* | (2006.01) |
| *H01L 21/02* | (2006.01) |
| *H01L 21/28* | (2006.01) |
| *H01L 21/285* | (2006.01) |
| *H01L 21/67* | (2006.01) |
| *B08B 5/00* | (2006.01) |
| *C23C 14/02* | (2006.01) |
| *C23C 16/02* | (2006.01) |
| *C23C 14/58* | (2006.01) |
| *C23C 16/56* | (2006.01) |

(52) U.S. Cl.
CPC .......... *H01L 21/02046* (2013.01); *B08B 5/00* (2013.01); *C23C 14/022* (2013.01); *C23C 14/5806* (2013.01); *C23C 16/0245* (2013.01); *C23C 16/56* (2013.01); *H01L 21/28052* (2013.01); *H01L 21/28518* (2013.01); *H01L 21/67167* (2013.01); *H01L 21/67213* (2013.01)

(58) Field of Classification Search
CPC ......... H01L 21/02046; H01L 21/28052; H01L 21/28518; H01L 21/67167; H01L 21/67213; H01L 21/02299–02315; H01L 21/02658–02661; B08B 5/00; C23C 14/022; C23C 14/5806; C23C 16/0245; C23C 16/56; C23C 14/0635; C23C 16/42; C23C 14/02–028; C23C 16/02–029; C01B 33/06
USPC ....................................... 438/586
See application file for complete search history.

(56) References Cited

U.S. PATENT DOCUMENTS

| | | | |
|---|---|---|---|
| 2004/0061169 A1* | 4/2004 | Leam | H01L 27/105 257/315 |
| 2007/0202254 A1* | 8/2007 | Ganguli | H01L 21/76846 427/252 |
| 2013/0160795 A1* | 6/2013 | Xiao | G03F 7/427 134/1.2 |
| 2018/0308695 A1* | 10/2018 | LaVoie | H01L 21/31138 |

* cited by examiner

*Primary Examiner* — Calvin Y Choi
(74) *Attorney, Agent, or Firm* — Muncy, Geissler, Olds & Lowe, P.C.

(57) ABSTRACT

A pre-processing method, a method for forming a metal silicide and a semiconductor processing apparatus are disclosed by the present invention. In the pre-processing method, a plasma etching process is performed on a semiconductor structure including a substrate. A first conductive portion and an isolation spacer covering a side surface of the first conductive portion are formed on a surface of an active area in the substrate. In the plasma etching process, a bias voltage applied to a surface of the semiconductor structure is adjusted by adjusting power outputs of two RF sources and is not lower than 150 V. In the metal silicide formation method, after a semiconductor structure including a first conductive portion and a second conductive portion is pre-processed in the manner as described above, a metal film is deposited thereon and annealed to result in the formation of the metal silicide.

9 Claims, 3 Drawing Sheets

| S1 — providing a semiconductor structure comprising a substrate, a first conductive portion formed on the substrate, an isolation spacer covering a side surface of the first conductive portion, and a second conductive portion adjoined to the isolation spacer from a side away from the first conductive portion, wherein the second conductive portion is situated in the substrate and extends to a surface of the substrate S2 — pre-processing the semiconductor structure by performing a plasma etching process to remove a material from an exposed surface of the semiconductor structure, wherein the plasma etching process is performed by an apparatus equipped with two RF sources, and wherein a bias voltage applied to the surface of the semiconductor structure is adjusted by adjusting power outputs of the two RF sources and the bias voltage is controlled to be not lower than 150 V S3 — depositing a metal film over the pre-processed semiconductor structure, wherein the metal film covers exposed surfaces of the first conductive portion, the isolated spacer and the second conductive portion S4 — thermally annealing the semiconductor structure deposited with the metal film so that a metal silicide is formed from a reaction between silicon at the surfaces of the first and second conductive portions and the metal film S5 — removing the metal film that is not subjected to the reaction

Fig.5

PRE-PROCESSING METHOD, METHOD FOR FORMING METAL SILICIDE AND SEMICONDUCTOR PROCESSING APPARATUS

CROSS-REFERENCE TO RELATED APPLICATION

This application claims the priority of Chinese patent application number 201910611966.1, filed on Jul. 8, 2019, the entire contents of which are incorporated herein by reference.

TECHNICAL FIELD

The present invention relates to the field of integrated circuits and, in particular, to a pre-processing method for a semiconductor structure, a method for forming a metal silicide and a semiconductor processing apparatus.

BACKGROUND

The development of integrated circuit technology leads to increasing integration of electronic components and decreasing critical dimensions and geometric sizes of semiconductor structures formed during the fabrication of such electronic components. Since a traditionally fabricated MOS transistor has high gate and source/drain resistances, a method for forming a metal silicide over the source/drain regions and polysilicon gate, which are exposed on the surface of a silicon substrate, is adopted so as to reduce their resistances.

Before such a metal silicide is formed, pre-processing of the substrate surface, also known as pre-silicide clean, is necessary mainly for removing a native oxide layer formed on an active area (AA) of the silicon surface during transfer between processes. Subsequent to removal of the native oxide layer, a metal layer such as nickel, titanium or cobalt may be deposited over the substrate surface and then experience a thermal annealing treatment, where the metal covering the silicon surface (e.g., nickel, titanium or cobalt) will react with silicon but not with any silicon oxide such as silicon dioxide, silicon nitride such as $Si_3N_4$ or silicon oxynitride, follow by removal of any unreacted metal remaining from the reaction. As a result, a metal silicon layer is formed over the exposed source/drain regions and polysilicon gate.

However, such metal silicides formed using existing methods fail to provide satisfactory quality.

SUMMARY OF THE INVENTION

In order to completely remove a native oxide layer and other contaminants present on the surface of a substrate, the present invention provides a pre-processing method for a semiconductor structure. Moreover, in order to achieve improved metal silicide quality, the present invention also provides a method for forming a metal silicide and a semiconductor processing apparatus.

In one aspect, the present invention provides a pre-processing method for a semiconductor structure. The method includes the steps of: providing the semiconductor structure, wherein the semiconductor structure comprises a substrate containing an active area, a first conductive portion formed over a portion of a surface of the active area and an isolation spacer covering a side surface of the first conductive portion; and pre-processing the semiconductor by performing a plasma etching process to remove a material from an exposed surface of the semiconductor structure, wherein the plasma etching process is performed by an apparatus equipped with two RF sources, and wherein a bias voltage to the surface of the semiconductor structure is adjusted by adjusting power outputs of the two RF sources and the bias voltage is controlled to be not lower than 150 V.

Optionally, the plasma etching process may be a sputter etching process utilizing Ar and/or He as a process gas.

Optionally, the bias voltage may not exceed 260 V.

Optionally, the material removed from the removed from the exposed surface of the semiconductor structure may include a native oxide layer, wherein an etching time of the plasma etching process ranges from 7 s to 22 s.

Optionally, the substrate may be a silicon substrate or an SOI substrate, wherein the first conductive portion is a gate of a MOS transistor.

In another aspect of the present invention, there is provided a method for forming a metal silicide, comprising the steps of:

providing a semiconductor structure comprising a substrate, a first conductive portion formed on the substrate, an isolation spacer covering a side surface of the first conductive portion and a second conductive portion adjoined to the isolation spacer from a side away from the first conductive portion, and wherein the second conductive portion is situated in the substrate and extends to a surface of the substrate; pre-processing the semiconductor structure by performing a plasma etching process to remove a material from an exposed surface thereof, wherein the plasma etching process is performed by an apparatus equipped with two RF sources, and wherein a bias voltage applied to the surface of the semiconductor structure is adjusted by adjusting power outputs of the two RF sources and the bias voltage is controlled to be not lower than 150 V; depositing a metal film over the pre-processed semiconductor structure, wherein the metal film covers exposed surfaces of the first conductive portion, the isolated spacer and the second conductive portion; thermally annealing the semiconductor structure deposited with the metal film so that a metal silicide is formed by a reaction between silicon at the surfaces of the first and second conductive portions, and the metal film; and removing the metal film that is not subjected to the reaction.

Optionally, the metal film may comprise at least one selected from the group consisting of Ni, Ti, W, Co, Mn, Mo, Zr, Ta, W, Pd, Pt and Yb or an alloy thereof.

Optionally, the first conductive portion may be a gate of a MOS transistor, wherein the second conductive portion is a source or a drain region of the MOS transistor.

In yet another aspect of the present invention, there is provided semiconductor processing apparatus, comprising:

a loading chamber configured to provide a semiconductor structure, wherein the semiconductor structure comprises a substrate, a first conductive portion located on the substrate, an isolation spacer covering a side surface of the first conductive portion and a second conductive portion adjoined to the isolation spacer from a side away from the first conductive portion, the second conductive portion situated in the substrate and extending to a surface of the substrate;

a pre-processing chamber configured to the semiconductor structure transferred from the loading chamber and perform a pre-processing for the semiconductor structure, wherein the pre-processing removes a material from an exposed surface of the semiconductor structure by a plasma etching, wherein the pre-processing chamber is equipped with two RF sources, and during the pre-processing, and a bias voltage applied to the surface of the semiconductor structure is adjusted by adjusting power outputs of the two RF sources and the bias voltage is controlled to be not lower than 150 V;

a deposition chamber configured to receive the pre-processed semiconductor structure transferred from the pre-processing chamber and deposit a metal film over the pre-processed semiconductor structure; and a transfer device configured to transfer the semiconductor structure among the loading, pre-processing and deposition chambers.

Optionally, the deposition of the metal film by the deposition chamber may be accomplished by one of physical vapor deposition, chemical vapor deposition and atomic layer deposition.

In the pre-processing method of the present invention, during performing the sputter etching process, a material is removed from the exposed surface of the semiconductor structure to perform the pre-processing for the semiconductor structure and the bias voltage applied to the surface of semiconductor structure is controlled to be not lower than 150 V. Such a relatively high bias voltage is helpful in avoiding substances falling from the isolation spacer from staying on the substrate surface, thus improving surface cleanliness of the pre-processed semiconductor structure.

In the metal silicide formation method of the present invention, prior to depositing a metal film, the pre-processing is performed for the semiconductor structure. Then the metal film is deposited over the pre-processed semiconductor structure and then thermally annealed is performed so that silicon at the surfaces of the first and second conductive portions react with the metal film to result in the formation of the metal silicide. Since the relatively high bias voltage is helpful in avoiding substances falling from the isolation spacer from staying on the substrate surface, during deposition of the metal film, there is an extremely tiny amount of impurities and oxides present, particularly on the surface of the second conductive portion, allowing silicon on the second conductive portion to fully react with the metal film to ensure higher quality of the resulting metal silicide on the semiconductor structure and hence improved product yield.

In the semiconductor processing apparatus of the present invention, when the semiconductor structure received from the loading chamber is being pre-processed by a plasma etching process carried out within the pre-processing chamber, the bias voltage applied to surface of the semiconductor structure, that is not lower than 150 V, can mitigate or avoid staying of substances falling from the isolation spacer on the substrate surface and thus ensure that, when the semiconductor structure is transferred into the deposition chamber and being deposited with a metal film therein, there are almost no impurities or oxides at the interface between the metal film and particularly the second conductive portion. This can help in reducing defects of the product being fabricated and increasing its yield.

BRIEF DESCRIPTION OF THE DRAWINGS

FIG. 5 is a flowchart of a method for forming a metal silicide according to an embodiment of the present invention.

In these figures,
   10: a metal silicide layer; 20: a conductive layer; 30 and 120: an isolation spacer; 100: a substrate; 101: a native oxide layer; 110: a first conductive portion; 130: a second conductive portion; 210: a loading chamber; 220: a pre-processing chamber; 230: a deposition chamber; and 240: a transfer device.

DETAILED DESCRIPTION

During the fabrication of an electronic component, a substrate serving as a carrier and a semiconductor structure formed on the substrate is transferred between various pieces of process equipment and chambers, and sometimes brought into exposure to the ambient air, giving rise to the formation of a natural oxide such as silicon dioxide on the exposed surface of the semiconductor structure. In addition, some contaminants may also fall on the exposed surface of the semiconductor structure. In processes requiring a certain degree of cleanliness of the substrate surface, the semiconductor structure must be pre-processed to remove the natural oxide and contaminants from the surface.

Figure 1:
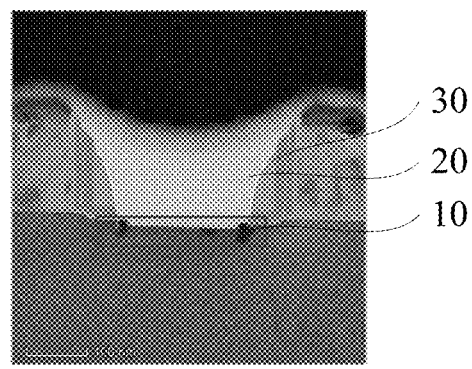
FIG. 1 is an electron micrograph of a semiconductor structure.

During the formation of a metal silicide, in order to obtain a clean silicon surface, a pre-processing is required to be performed for related semiconductor structure so as to remove a native oxide layer thereon. Generally, the removal is accomplished with a sputter etching process, in which a plasma of an inert gas is used to bombard the silicon surface to remove the native oxide layer and thus obtain a clean silicon surface. However, silicon surfaces treated with existing sputter etching techniques suffer from various issues. FIG. 1 shows an electron micrograph of a semiconductor structure. As shown in FIG. 1, the semiconductor structure includes a stack of a metal silicide layer 10 and a conductive layer 20 that is formed in a recess defined between neighboring spacers 30. However, the metal silicide layer 10 is discontinuous and partially missing (in portions marked with the box) over a silicon surface due to the presence of several impurity particles. This may deteriorate a contact resistance of the conductive layer 20 and hence the performance of the electronic component being fabricated or even a decrease in product yield.

In view of the above, the present invention proposes a pre-processing method for a semiconductor structure, a method for forming a metal silicide and a semiconductor processing apparatus, which can reduce impurities remaining on a silicon surface and help in enhancing the quality of the metal silicide formed on the semiconductor structure and hence improving product yield. Specific embodiments of the pre-processing method, the method for forming a metal silicide and the semiconductor processing apparatus will be described in greater detail below with reference to the accompanying drawings. Specifically, these embodiments are suitable for use in integrated circuit processes of 0.11 μm and smaller technology nodes. However, they are not so limited and can also be used for other technology nodes depending on actual pre-processing or metal silicide formation needs.

It should be noted that the figures are presented in a very simplified form not necessarily drawn to scale, with their only intention to facilitate convenience and clarity in explaining the disclosed embodiments. These embodiments should not be considered as being limited to the specific shapes shown in the figures. For the sake of clarity, throughout the drawings for assisting in explaining the embodiments disclosed herein, like elements are in principle given like reference numerals and will not be repeatedly described hereinafter. As used in the following description, the terms "first", "second" and the like are meant to distinguish between similar elements and do not necessarily imply any particular ordinal or chronological sequence. It is to be appreciated that, where appropriate, these terms used in such a way are interchangeable.

Figure 2:
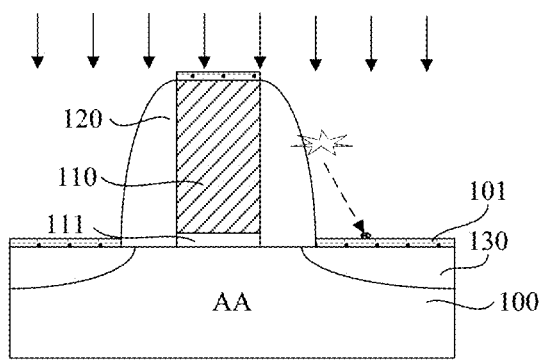
FIG. 2 schematically illustrates how a semiconductor structure is pre-processed under a relatively small bias voltage.

FIG. 2 schematically illustrates how the semiconductor structure is pre-processed under a relatively small bias voltage. In the embodiment of FIG. 2, the semiconductor structure includes a substrate 100 containing an active area (AA), a first conductive portion 110 formed over a portion of a surface of the active area and an isolation spacer 120 covering a side surface of the first conductive portion 110.

In particular, the substrate 100 may be formed of silicon (Si), germanium (Ge), silicon germanium (SiGe), silicon carbide, gallium arsenide (GaAs), gallium phosphide (GaP), indium phosphide (InP), indium arsenide (InAs), indium antimonide (InSb) or the like, or implemented as a silicon on insulator (SOI) or germanium-on-insulator (GOI) substrate, or made of a different material such as GaAs, GaAsP, AlInAs, AlGaAs, GaInAs, GaInP, GaInAsP or the like or a combination thereof. The substrate 100 may include a doped epitaxial layer, a gradient semiconductor layer and a semiconductor layer on another semiconductor layer of a different type (e.g., a silicon layer on a germanium silicon layer). In addition to the active area, the substrate 100 may also have isolation regions (not shown) that isolate the active area. Further, the substrate 100 may be implanted with certain doping ions for changing an electrical parameter as required by the design. The semiconductor structure according to this embodiment can be considered as an intermediate structure for forming an electronic component on the substrate 100. Examples of the electronic component may include memory cells and/or logic circuits, or at least one of metal-oxide-semiconductor field effect transistors (MOSFETs), complementary metal oxide semiconductor (CMOS) devices, p-channel field effect transistors (pFETs), n-channel field effect transistors (nFETs), high-voltage transistors and high-frequency transistors, or other suitable components.

In this embodiment, the first conductive portion 110 located on the substrate may be, for example, a polysilicon gate of a MOSFET (for short, MOS) transistor. The polysilicon exhibits suitable conductivity resulting from a doping process. The MOS transistor may also include source/drain regions situated in the substrate 100 on opposing sides of the polysilicon gate. A suitable structure such as a tunneling oxide layer 111 may be interposed between the first conductive portion 110 and the substrate 100. Examples of a material from which the tunneling oxide layer 111 is fabricated may include silicon oxides, silicon oxynitrides, silicon nitrides, high-k and other dielectric materials, or combinations thereof. However, the present invention is not limited thereto, because in other embodiments, the first conductive portion 110 may also contain another conductive material such as a metal. In other embodiments, the semiconductor structure may further include a memory cell. In this case, a polysilicon floating gate and an oxide-nitride-oxide (ONO) dielectric layer may be further sequentially deposited on the tunneling oxide layer between the first conductive portion 110 and substrate 100.

The isolation spacer 120 covering the side surface of the first conductive portion 110 can protect the first conductive portion 110 and keep it insulated from a neighboring conductive portion. Examples of a material from which the isolation spacer 120 is fabricated can include oxides such as silicon oxides, nitrides such as silicon nitrides and oxynitrides such as silicon oxynitrides. Depending on the design requirements, the isolation spacer 120 over the side surface of the first conductive portion 110 may be formed by multiple deposition and etching processes. In this embodiment, the isolation spacer 120 may include, for example, an inner silicon oxide layer on the side surface of the first conductive portion 110, a silicon nitride layer on the inner silicon oxide layer and an outer silicon oxide layer (not shown) on the silicon nitride layer. Since the formation of the isolation spacer 120 typically involves a self-aligned etching process, its outer surface forms an acute angle with the surface of the substrate 100, i.e., the spacer 120 is substantially inclined.

Further, in this embodiment, the semiconductor structure may further include a second conductive portion 130 adjoined to the isolation spacer 120 from the side away from the first conductive portion 110. The second conductive portion 130 may be formed in the substrate 100 and extends to the surface of the substrate 100. In other words, the second conductive portion 130 is situated within the substrate 100 and close to the first conductive portion 110, while the latter is located on the substrate 100. Continuing the above example of a MOS transistor, the second conductive portion 130 according to this embodiment corresponds to at least one source/drain region of the MOS transistor. Depending on a type of the MOS transistor, the source/drain region may be doped with a p-type (such as boron or $BF_2$) or n-type dopant (such as phosphorus or arsenic).

The semiconductor structure may be formed by performing a set of processes on the substrate 100, including multiple deposition, photolithography, dry or wet etching processes, according to any suitable scheme that has been disclosed in the art, and the present invention is not limited to any particular such method. Prior to pre-processing, a native oxide layer 101 needing to be removed may be grown on the surface of semiconductor structure.

The semiconductor structure may be pre-processed generally using a plasma etching approach such as a sputter etching method. Specifically, an apparatus for carrying out such a sputter etching process may produce, by ionization, a plasma containing ions, which are then attracted and moved toward the semiconductor structure under the action of a bias voltage applied to the surface of the semiconductor structure. The bias voltage may be attributed to radio-frequency (RF) biasing energy exerted to a holder that supports the semiconductor structure. Ions in the plasma normally strike the exposed surface (the exposed surface is perpendicular to moving direction of the ions) of the semiconductor structure (here, which includes top surfaces of the first conductive portion 110, isolation spacer 120 and second conductive portion 130 as well as the remaining exposed top surface of the substrate 100), thereby removing the exposed material on the surface, so that the aim of removing the natural oxide and any other contaminants is achieved.

With the pre-processing being accomplished by a sputter etching process as an example, an apparatus for performing the sputter etching process may include ICP and RF sources, which are configured in a manner well known to those of ordinary skill in the art. For example, two RF sources may be used to together generate a DC bias voltage deliverable under various RF frequencies such as 2 MHz, 13.56 MHz and 60 MHz, or combinations thereof. The bias voltage applied to the surface of the semiconductor structure (herein, i.e., the bias voltage applied by the two RF sources to the holder for the semiconductor structure) may further attract ions in the plasma toward bottom surfaces of trenches or vias in the semiconductor structure so as to also clean these surfaces by material removal therefrom.

When pre-processing the semiconductor structure as shown in FIG. 2 using a sputter etching process, an inert gas such as argon (Ar) or helium (He) may be ionized into a plasma, and ions in the plasma may bombard the exposed surface of the semiconductor structure under the action of an electrical field, removing the natural oxide and any other contaminants therefrom. However, it has been found in a study that, the sputter etching process, when performed in a certain bias voltage range, cannot sufficiently clean the surface of the semiconductor structure, especially the active area surface of the substrate near the isolation spacer, in a desired manner, as reflected in particular by impurities still found on the surface of the second conductive portion 130, which may impair the performance of subsequent processes, for example, resulting in the formation of a poor-quality metal silicide on the second conductive portion 130 (see FIG. 1).

In this embodiment, an apparatus for performing a sputter etching process may be, for example, an etching, PCXT or pre-cleaning chamber available from Applied Materials, Inc. Of course, any other suitable sputter etching apparatus from a different manufacturer may also be used in accordance with the present invention. Specifically, in this embodiment, the sputter etching apparatus may include two RF sources and a holder for supporting the semiconductor structure. During sputter etching, the two RF sources may apply a bias voltage to the holder and thereby to the semiconductor structure. The bias voltage applied to the semiconductor structure may be adjusted through changing power outputs (i.e., output RF biasing energy) of the two RF sources. For example, the bias voltage applied to the holder may be about −44.72 V (the negative sign indicates the direction of ions) when the power outputs of the two RF sources, denoted at RF1 and RF2, are respectively set to 300 W and 100 W; about −72.54 V, when the power outputs of the two RF sources are respectively set to 400 W and 200 W; about −71.37 V, when the power outputs of the two RF sources are respectively set to 200 W and 100 W; and about −75.5 V, when the power outputs of the two RF sources are respectively set to 160 W and 80 W. In this embodiment, a process gas used for sputter etching may be, for example, Ar.

However, under the sputter etching conditions as discussed above, as shown in FIG. 1, the resulting cleanliness of the surface of the semiconductor structure, especially the active area surface of the substrate around the isolation spacer 120, is still barely satisfactory. In addition, removal of the native oxide layer deteriorates with the decreasing of the bias voltage (absolute value). Further, under the above bias voltage conditions, the cleaning performance worsens with the extension of the etching time, for example, from 7 seconds (s) to 37 s.

With reference to FIG. 2, the inventors have found from research that in the sputter etching process performed on the semiconductor structure, Ar ions in the plasma (when Ar is used as the process gas, for example) strike the exposed surface of the semiconductor structure along a normal direction of the substrate 100. In this process, the outer surface of the isolation spacer 120 is also impacted by the plasma (e.g., Ar ions), with the material there being etched away and falling from the isolation spacer (as indicated by the dashed line in FIG. 2). This will lead to new contamination on the surface of the substrate 100 around the isolation spacer 120, making it difficult to completely remove impurities from the active area surface in proximity of the isolation spacer 120 and thus resulting in inferior pre-processing results. As a result, the overall performance of the electronic component may be affected. For example, when a metal film is subsequently deposited over the pre-processed substrate and annealed to react with silicon on the surface of the second conductive portion 130 to result in the formation of a metal silicide, impurities remaining on the surface of the second conductive portion 130 will adversely affect the continuity of the resulting metal film and hinder the reaction between the metal and silicon, making the resulting metal slicide inferior in quality.

On the basis of the above analysis, in embodiments of the present invention, there is provided a pre-processing method for a semiconductor structure, including the steps of:

Step 1: providing a semiconductor structure, wherein the semiconductor structure comprises a substrate containing an active area, a first conductive portion formed over a portion of a surface of the active area, and an isolation spacer covering a side surface of the first conductive portion; and Step 2: pre-processing the semiconductor by performing a plasma etching process to remove a material from an exposed surface of the semiconductor structure, wherein the plasma etching process is performed by an apparatus equipped with two RF sources, and wherein a bias voltage applied to a surface of the semiconductor structure is adjusted by adjusting power outputs of the two RF sources and the bias voltage is controlled to be not lower than 150 V.

Figure 3:
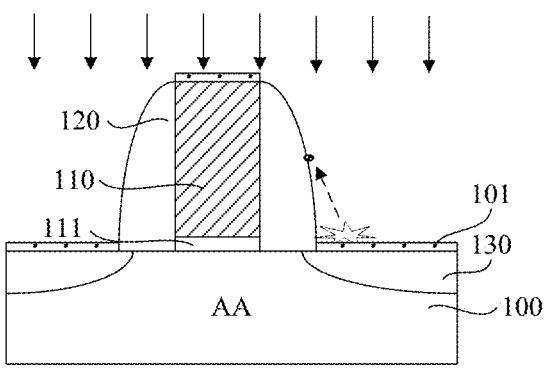
FIG. 3 schematically illustrates how a semiconductor structure is pre-processed in accordance with an embodiment of the present invention.
Figure 4:
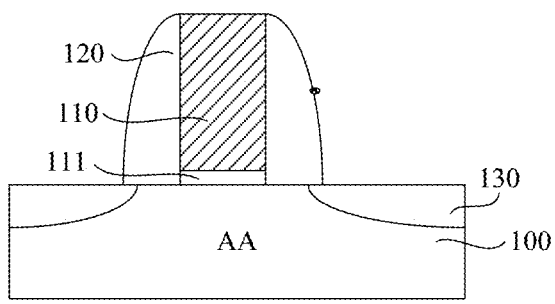
FIG. 4 shows a cross-sectional view of a pre-processed semiconductor structure in accordance with an embodiment of the present invention.

Reference can be made to the above description for details in the various components of the semiconductor structure, and a more detailed description of this method given below will focus on Step 2. FIG. 3 schematically illustrates how a semiconductor structure is pre-processed in accordance with an embodiment of the present invention, and FIG. 4 shows a cross-sectional view of a pre-processed semiconductor structure in accordance with an embodiment of the present invention. With reference to FIGS. 3 and 4, specifically, in order to mitigate or avoid the falling of substances removed from the isolation spacer 120 during sputter etching onto a neighboring portion of the active area surface (here, the active area surface portion neighboring the isolation spacer 120 may include the top surface of the second conductive portion 130), the bias voltage applied to the surface of the semiconductor structure in the sputter etching process may be increased, in particular, to a value not lower than 150 V. Such a relatively higher bias voltage can significantly strengthen the bombardment of ions in the plasma against the surface of the substrate 100, while less enhancing the bombardment against the substantially vertical surface of the isolation spacer 120. Additionally, the bombarding ions bound to the surface of the substrate 100 will also strongly act on the substances bombarded off the isolation spacer 120 and tend to cause them to move from the surface of the substrate 100 back onto the isolation spacer 120. As a result, the pre-processed semiconductor structure will be as shown in FIG. 4, where the native oxide layer 101 has been removed, and substances falling from the isolation spacer 120 remain on the surface thereof due to the strong plasma bombardment action. Therefore, pulling up the bias voltage can, on the one hand, strengthen the etching performance of the sputter etching process on the surface of the substrate 100, and on the other hand, enable substances falling from the isolation spacer 120 to move from the active area surface of the substrate 100 back to the isolation spacer 120 and optionally be evacuated from the pre-processing chamber by a piping system in the sputter etching apparatus. For these reasons, raising the bias voltage to 150 V or higher is helpful in avoiding substance falling from the isolation spacer 120 from staying on the surface of the substrate 100 and thus improving the surface cleanliness of the pre-processed semiconductor structure.

In Step 2, the bias voltage may be adjusted to 150 V or higher by tuning power outputs of the two RF sources (denoted respectively at RF1 and RF2) in the apparatus that carries out the sputter etching process. For example, it is possible to adjust the power outputs of RF2 and RF1 both to 100 W to obtain a bias voltage of −152.43 V applied to a holder that carries the semiconductor structure. Alternatively, the bias voltage applied to the holder may also be adjusted to −251 V through tuning RF2 and RF1 to 50 W and 100 W, respectively. Here, the negative signs are related to the direction of an electrical field. In order to avoid, for example, damage to the substrate under an excessive bias voltage value, the bias voltage is preferred to not exceed 260 V.

In the pre-processing method according to this embodiment, the plasma may be produced from an inert gas such as Ar and/or He, which may optionally further contain, for example, $H_2$ or $N_2$ as a carrier gas. Since the pre-processing aims to remove the native oxide layer 101 on the substrate surface, the etching process in Step 2 preferably lasts for 7-22 s. As usual, the sputter etching apparatus may include a vacuum control system and a degree of vacuum generally in the range of from 45 mTorr to 100 mTorr is maintained in the pre-processing chamber during the sputter etching process.

In the sputter etching process in the pre-processing method as defined above, a bias voltage not lower than 150 V is applied to the surface of the semiconductor structure to remove substances from an exposed surface thereof. Such a relatively high bias voltage helps avoid substances falling from the isolation spacer from staying on the substrate surface and thus improve the surface cleanliness of the pre-processed semiconductor structure.

A method for forming a metal silicide according to an embodiment of the present invention will be described below. FIG. 5 shows a flowchart of this method. Referring to FIG. 5, the method according to this embodiment includes the steps of:

S1: providing a semiconductor structure comprising a substrate, a first conductive portion formed on the substrate, an isolation spacer covering a side surface of the first conductive portion, and a second conductive portion adjoined to the isolation spacer from a side away from the first conductive portion, wherein the second conductive portion is situated in the substrate and extends to a surface of the substrate;

S2: pre-processing the semiconductor structure by performing a plasma etching process to remove a material from an exposed surface of the semiconductor structure, wherein the plasma etching process is performed by an apparatus equipped with two RF sources, and wherein a bias voltage applied to the surface of the semiconductor structure is adjusted by adjusting power outputs of the two RF sources and the bias voltage is controlled to be not lower than 150 V;

S3: depositing a metal film over the pre-processed semiconductor structure, the metal film continuously covering exposed surfaces of the first conductive portion, the isolation spacer and the second conductive portion;

S4: thermally annealing the semiconductor structure deposited with the metal film so that the metal silicide is formed from a reaction between silicon at the surfaces of the first and second conductive portions and metal film; and S5: removing the metal film that is not subjected to the reaction.

Reference can be made to the above description for details in the various components of the semiconductor structure processed in the method according to this embodiment. For example, the semiconductor structure may include a MOS transistor formed on the substrate. Referring to FIG. 3, in this case, the first conductive portion 110 may be a polysilicon gate of the MOS transistor, while the second conductive portion 130 may be at least one source/drain region. By forming the metal silicide, contact resistances of conductive plugs formed subsequently on the polysilicon gate and source/drain region can be lowered.

Step S2 is similar to the pre-processing process in the above-described pre-processing method, in which a plasma etching process utilizing a bias voltage not lower than 150 V, such as a sputter etching process, is carried out on the surface of the semiconductor structure in order to pre-process the semiconductor structure through removing material from an exposed surface portion thereof. Since the exposed surface spans across a top surface of the first conductive portion 110, an outer surface of the isolation spacer 120 and a top surface of the second conductive portion 130, the pre-processed top surfaces of the first and second conductive portion 110, 130 can be well cleaned. That is, top surfaces of the first and second conductive portions 110, 130 are clean silicon surfaces helpful in the subsequent formation thereon of a metal silicide with higher quality.

In step S3, the metal film may be formed by a process such as physical vapor deposition, chemical vapor deposition or atomic layer deposition. The metal film covers the exposed surface of the semiconductor structure, consisting of the exposed surfaces of the first conductive portion 110, the isolation spacer 120 and the second conductive portion 130. The metal film may be at least one selected from the group consisting of Ni, Ti, W, Co, Mn, Mo, Zr, Ta, W, Pd, Pt and Yb or an alloy thereof.

In step S4, thermally annealing the semiconductor structure in an atmosphere of hydrogen, nitrogen, helium so that the metal film covering the silicon surfaces of the first and second conductive portions 110, 130 in the semiconductor structure may react with silicon to form the metal silicide. The thermal annealing process may be, for example, one of annealing processes such as rapid thermal annealing, constant-temperature annealing, spike annealing, flash annealing and laser annealing. The thermal annealing process may be performed at a temperature ranging from about 400° C. to 700° C. The resulting metal silicide contains the same metal element(s) as the metal film. For example, when the metal film is a cobalt (Co) film, the metal silicide will be cobalt silicide ($CoSi_2$). In some embodiments, depending on the material of the metal film, the metal silicide may also contain one or more of silicides such as TiSi and WSi.

In step S5, removing the metal film that is not subjected to the reaction. Specifically, this can be accomplished by selective etching, for example, through cleaning the surface of the semiconductor structure, on which the metal silicide has been formed, with an etchant composed of a strong acid and a strong oxidant. With the unreacted metal film being completely removed, the metal silicide formed over the top surfaces of the first and second conductive portions 110, 130 will be remained.

In the method according to this embodiment, before depositing the metal film, the pre-processing is performed for semiconductor structure and, after the pre-processing, the metal film is deposited over the semiconductor structure and the thermal annealing is performed, so that the surfaces of the first and second conductive portions 110, 130 react with the metal film to form the metal silicide. Since the relatively high bias voltage used is helpful in avoiding substances falling from the isolation spacer from staying on the substrate surface, there are few impurities and oxides particularly on the surface of the second conductive portion 130. Therefore, the deposited metal film is allowed to fully react with silicon at the surface of the second conductive portion 130, resulting in improved quality of the metal silicide on the semiconductor structure. As demonstrated by an experiment embodying the method according to this embodiment, in which pre-processing was performed using Ar as a process gas at a flow rate of 7 sccm and a bias voltage of −152 V was applied to the surface of the semiconductor structure, an increase of 2 percent in product yield was obtained due to the improved surface cleanliness. Therefore, this method is helpful in improving product yield.

Figure 6:
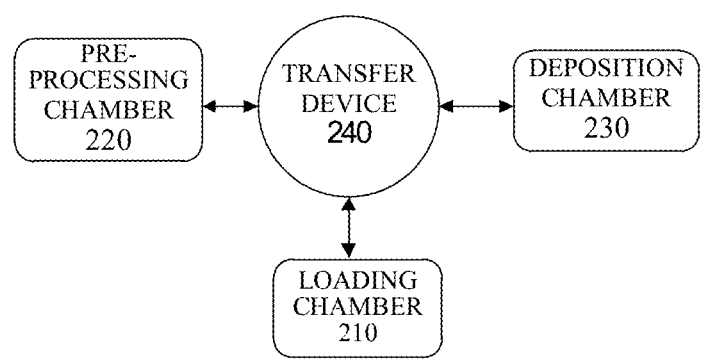
FIG. 6 is a block diagram schematically illustrating a semiconductor processing apparatus according to an embodiment of the present invention.

A semiconductor processing apparatus according to an embodiment of the present invention will be described below. FIG. 6 shows a block diagram of the semiconductor processing apparatus. Referring to FIG. 6, the semiconductor processing apparatus according to this embodiment includes a loading chamber 210, a pre-processing chamber 220, a deposition chamber 230 and a transfer device 240.

Specifically, the loading chamber 210 is configured to provide a semiconductor structure (see FIG. 3) including a substrate 100, a first conductive portion 110 located on the substrate, an isolation spacer 120 covering a side surface of the first conductive portion 110 and a second conductive portion 130 adjoined to the isolation spacer 120 from the side away from the first conductive portion 110. The second conductive portion 130 is situated in the substrate 100 and extends to a surface of the substrate 100. The pre-processing chamber 220 is configured to receive the semiconductor structure transferred from the loading chamber 210 and pre-process the semiconductor structure by performing a sputter etching process so as to remove material from an exposed surface of the semiconductor structure. The pre-processing chamber is provided with two RF sources and during pre-processing, adjusting a bias voltage applied to the surface of the semiconductor structure, by adjusting power outputs of the two RF sources and the bias voltage is controlled to be not lower than 150 V.

In this embodiment, the loading chamber 210 and pre-processing chamber 220 in the semiconductor processing apparatus may be configured to perform steps 1 and 2 in the above-described pre-processing method or steps S1 and S2 in the above-described metal silicide formation method, respectively. Through processing the semiconductor structure in the loading chamber 210 and pre-processing chamber 220, especially through pre-processing the semiconductor structure in the pre-processing chamber 220, in which the bias voltage applied to the surface of the semiconductor structure is set to 150 V or higher, staying of substances falling from the isolation spacer 120 on the surface of the substrate 100 can be mitigated or avoided, and natural oxides and contaminants on the exposed surface of the semiconductor structure can be well eliminated by plasma bombardment.

In this embodiment, the deposition chamber 230 in the semiconductor processing apparatus is configured to receive the pre-processed semiconductor structure from the pre-processing chamber 220 and deposit a metal film over the semiconductor structure. The deposition of the metal film in the deposition chamber may be accomplished by any of deposition methods including physical vapor deposition, chemical vapor deposition and atomic layer deposition. In the deposition chamber 230, the surface of the pre-processed semiconductor structure, on which the metal film is deposited, is clean, allowing improved quality of the metal film because of nearly absence of impurities or oxides present between the metal film and the surface of the semiconductor structure, especially the top surfaces of the first and second conductive portions 110, 130. This allows good contact and thus fewer defects and higher yield of the product being fabricated. Subsequently, the semiconductor structure covered with the metal film can successively receive a thermal annealing treatment in an annealing device and an etching process for removing an unreacted portion of the metal film in an etching device. These treatments correspond to steps S3-S5 in the above-described metal silicide formation method. Thus, the process of formation of the metal silicide over the semiconductor structure is achieved.

In this embodiment, the transfer device 240 in the semiconductor processing apparatus is configured to transfer the semiconductor structure among the loading chamber 210, the pre-processing chamber 220 and the deposition chamber 230. The transfer device 240 may be, for example, a manipulator capable of picking up the semiconductor structure in a protecting vacuum or inert atmosphere and moving under precise mechanical control to place the semiconductor structure into a targeted one of the aforementioned chambers. With the transfer device, the semiconductor structure will not be brought into exposure to the ambient air after the pre-processing and prior to the deposition of the metal film, avoiding the possible formation of a new native oxide film, which may deteriorate the quality of the resulting metal film so that during the formation of the metal silicide, quality of the metal silicide and product yield are improved.

While the invention has been described with reference to several preferred embodiments, it is not intended to be limited to these embodiments in any way. Any person of skill in the art may make various possible variations and changes to the disclosed embodiments without departing from the spirit and scope of the invention. Accordingly, any and all such simple variations, equivalent alternatives and modifications made to the foregoing embodiments without departing from the scope of the invention are intended to fall within the scope thereof.

What is claimed is:

1. A pre-processing method for a semiconductor structure, comprising:

providing a semiconductor structure, wherein the semiconductor structure comprises a substrate containing an active area, a first conductive portion formed over a portion of a surface of the active area, and an isolation spacer formed by an inner silicon oxide layer, a silicon nitride layer and an outer silicon oxide layer sequentially covering a side surface of the first conductive portion, wherein a tunneling oxide layer is interposed between the first conductive portion and the substrate; and pre-processing the semiconductor structure by performing a plasma etching process to remove a material from an exposed surface of the semiconductor structure, wherein the plasma etching process is performed by an apparatus equipped with two RF sources, and wherein a bias voltage applied to a surface of the semiconductor structure is adjusted by adjusting power outputs of the two RF sources and the bias voltage is controlled to be in a range of 150 V-260 V.

2. The pre-processing method of claim 1, wherein the plasma etching process is a sputter etching process utilizing Ar and/or He as a process gas.

3. The pre-processing method of claim 1, wherein the material removed from the exposed surface of the semiconductor structure includes a native oxide layer, and wherein an etching time of the plasma etching process ranges from 7 s to 22 s.

4. The pre-processing method of claim 1, wherein the substrate is a silicon substrate or an SOI substrate, and wherein the first conductive portion is a gate of a MOS transistor.

5. A method for forming a metal silicide, comprising:
providing a semiconductor structure comprising a substrate, a first conductive portion formed on the substrate, an isolation spacer formed by an inner silicon oxide layer, a silicon nitride layer and an outer silicon oxide layer sequentially covering a side surface of the first conductive portion, and a second conductive portion adjoined to the isolation spacer from a side away from the first conductive portion, wherein the second conductive portion is situated in the substrate and extends to a surface of the substrate, and wherein a tunneling oxide layer is interposed between the first conductive portion and the substrate;
pre-processing the semiconductor structure by performing a plasma etching process to remove a material from an exposed surface of the semiconductor structure, wherein the plasma etching process is performed by an apparatus equipped with two RF sources, and wherein a bias voltage applied to the surface of the semiconductor structure is adjusted by adjusting power outputs of the two RF sources and the bias voltage is controlled to be in a range of 150 V-260 V;
depositing a metal film over the pre-processed semiconductor structure, wherein the metal film covers exposed surfaces of the first conductive portion, the isolation spacer and the second conductive portion;
thermally annealing the semiconductor structure deposited with the metal film so that a metal silicide is formed from a reaction between silicon at the surfaces of the first and second conductive portions and the metal film; and
removing the metal film that is not subjected to the reaction.

6. The method of claim 5, wherein the metal film comprises at least one selected from the group consisting of Ni, Ti, W, Co, Mn, Mo, Zr, Ta, W, Pd, Pt and Yb, or an alloy thereof.

7. The method of claim 5, wherein the first conductive portion is a gate of a MOS transistor, and the second conductive portion is a source or a drain region of the MOS transistor.

8. A semiconductor processing apparatus, comprising:
a loading chamber configured to provide a semiconductor structure, wherein the semiconductor structure comprises a substrate, a first conductive portion located on the substrate, an isolation spacer formed by an inner silicon oxide layer, a silicon nitride layer, and an outer silicon oxide layer sequentially covering a side surface of the first conductive portion and a second conductive portion adjoined to the isolation spacer from a side away from the first conductive portion, wherein the second conductive portion is situated in the substrate and extending to a surface of the substrate, and wherein a tunneling oxide layer is interposed between the first conductive portion and the substrate;
a pre-processing chamber configured to receive the semiconductor structure transferred from the loading chamber and perform a pre-processing for the semiconductor structure, wherein the pre-processing removes a material from an exposed surface of the semiconductor structure by a plasma etching, wherein the pre-processing chamber is equipped with two RF sources, and during the pre-processing, a bias voltage applied to the surface of the semiconductor structure is adjusted by adjusting power outputs of the two RF sources and the bias voltage is controlled to be in a range of 150 V-260 V;
a deposition chamber configured to receive the pre-processed semiconductor structure transferred from the pre-processing chamber and deposit a metal film over the pre-processed semiconductor structure; and
a transfer device configured to transfer the semiconductor structure among the loading, pre-processing and deposition chambers.

9. The semiconductor processing apparatus of claim 8, wherein the deposition of the metal film by the deposition chamber is accomplished by one of physical vapor deposition, chemical vapor deposition and atomic layer deposition.

* * * * *